(12) United States Patent
Westerberg et al.

(10) Patent No.: US 8,901,010 B2
(45) Date of Patent: Dec. 2, 2014

(54) METHODS FOR IMPROVING SOLAR CELL LIFETIME AND EFFICIENCY

(71) Applicant: SunPower Corporation, San Jose, CA (US)

(72) Inventors: Staffan Westerberg, Sunnyvale, CA (US); Florito Dennis Tingchuy Vicente, Paranaque (PH); Michael Cudzinovic, Sunnyvale, CA (US); Princess Carmi Tomada, Laguna (PH); Jemellee Guiao, Laguna (PH)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 13/837,802

(22) Filed: Mar. 15, 2013

(65) Prior Publication Data

US 2014/0273326 A1   Sep. 18, 2014

(51) Int. Cl.
 *H01L 21/461* (2006.01)
 *H01L 21/02* (2006.01)
 *H01L 31/18* (2006.01)

(52) U.S. Cl.
 CPC .......... *H01L 21/02288* (2013.01); *H01L 31/18* (2013.01)
 USPC .... 438/753; 438/510; 438/542; 257/E21.006; 257/E21.042; 257/E21.141; 257/E21.152; 257/E21.154; 257/E21.158; 257/E21.17; 257/E21.267; 257/E21.293; 257/E21.278; 257/E21.47; 257/E21.577

(58) Field of Classification Search
 USPC ......... 438/753, 501, 505, 508, 510, 542, 270, 438/700, 724, 723, 734, 680; 257/E21.006, 257/E21.042, E21.141, E21.152, E21.154, 257/E21.158, E21.17, E21.267, E21.293, 257/E21.278, E21.47, E21.577
 See application file for complete search history.

(56) References Cited

U.S. PATENT DOCUMENTS

| 4,029,518 | A  | * | 6/1977  | Matsutani et al. ............. 136/256 |
| 4,131,488 | A  | * | 12/1978 | Lesk et al. ........................ 438/71 |
| 4,252,865 | A  | * | 2/1981  | Gilbert et al. ................. 428/611 |
| 4,322,571 | A  | * | 3/1982  | Stanbery ........................ 136/255 |
| 7,557,367 | B2 | * | 7/2009  | Rogers et al. ...................... 257/9 |
| 8,084,293 | B2 | * | 12/2011 | Riordon et al. ................. 438/98 |

* cited by examiner

*Primary Examiner* — David Nhu
(74) *Attorney, Agent, or Firm* — Blakely Sokoloff Taylor Zafman LLP (57) ABSTRACT

Methods for protecting a texturized region and a lightly doped diffusion region of a solar cell to improve solar cell lifetime and efficiency are disclosed. In an embodiment, an example method includes providing a solar cell having a front side which faces the sun during normal operation and a back side opposite the front side, a silicon substrate and where the silicon substrate includes a texturized region and a lightly doped diffusion region. The method includes placing the solar cell on a receiving medium with the front side of the solar cell placed on an upper surface of the receiving medium, where the upper surface of the receiving medium prevents damage to the to the lightly doped diffusion region and damage to the texturized region on the front side of the solar cell during a contact printing process or transferring. In an embodiment, the lightly doped diffusion region has a doping concentration below $1 \times 10^{19}$ cm$^{-3}$ and the receiving medium includes a material having a moh's hardness in the range of 5-10.

20 Claims, 11 Drawing Sheets

METHODS FOR IMPROVING SOLAR CELL LIFETIME AND EFFICIENCY

TECHNICAL FIELD

Embodiments of the subject matter described herein relate generally to solar cell manufacture. More particularly, embodiments of the subject matter relate to depositing etch resists on solar cells and techniques for manufacture.

BACKGROUND

Solar cells are well known devices for converting solar radiation to electrical energy. They can be fabricated on a semiconductor wafer using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact fingers allow an external electrical circuit to be coupled to and be powered by the solar cell.

Lifetime is an important characteristic of a solar cell as it is directly related to the solar cell's capability to generate power. Accordingly, techniques for improving the fabrication process, reducing the cost of manufacturing and increasing the efficiency of solar cells are generally desirable.

BRIEF SUMMARY

Techniques for improving the fabrication process, reducing the cost of manufacturing and increasing the efficiency of solar cells are described herein. Such techniques include methods for fabricating solar cells, without damaging the solar cell structure, where one or more embodiments prevent damage to the solar cell and allow for improved solar cell lifetime and increased solar cell efficiency.

In an example, a method for forming a first etch resist on a solar cell is disclosed. The method includes providing a solar cell having a front side which faces the sun during normal operation and a back side opposite the front side. The method includes placing the solar cell on a receiving medium with the front side of the solar cell placed on an upper surface of the receiving medium, where the solar cell includes a lightly doped diffusion region and a texturized region on the front side. The method includes depositing the first etch resist on the back side of the solar cell using a contact printing method and where the upper surface of the receiving medium prevents damage to the to the lightly doped diffusion region and damage to the texturized region on the front side of the solar cell during a printing process. The method also includes removing the solar cell from the receiving medium and curing the first etch resist. In an embodiment, the first etch resist is a plating resist commonly used in the fabrication or manufacture of solar cells. In another embodiment, forming the first etch resist includes screen printing the first etch resist. In still another embodiment, a non-contact printing method is used to prevent damage to the texturized region and lightly doped diffusion region during the printing process, such as ink-jet printing. In yet another embodiment, a first protective layer can be deposited over the front side of the solar cell prior to depositing a first etch resist, where the first protective layer, instead of the receiving medium, protects the texturized region and lightly doped diffusion region from damage during printing.

In another example, a method for transferring a solar cell from a first location to a second location is disclosed. The method includes providing a solar cell having a front side which faces the sun during normal operation and a back side opposite the front side and a silicon substrate, where the silicon substrate includes a texturized region and a lightly doped diffusion region on the front side of the solar cell. The method includes picking the solar cell from on a first location using a contact transfer tool, where a bottom surface of the contact transfer tool contacts the front side of the solar cell. The method also includes placing the solar cell on a second location, where the bottom surface of the contact transfer tool prevents damage to the texturized region and the lightly doped region during the pick-and-place operation. In an embodiment, a non-contact transfer method is used to prevent damage to the texturized region and lightly doped diffusion region during the transfer process from the first location to a second location. In another embodiment, a first protective layer is deposited over the front side of the solar cell prior to the transfer process, where the first protective layer, instead of the receiving medium, protects the texturized region and lightly doped diffusion region from damage during transfer.

In still another example, a method for manufacturing a solar cell is disclosed. The method includes providing a solar cell having a front side which faces the sun during normal operation, a back side opposite the front side and a silicon substrate. The method includes forming a doped region on a silicon substrate of the solar cell and etching a texturized region on the silicon substrate. A lightly doped diffusion region is formed on the silicon substrate, where the lightly doped diffusion region is formed on the same side as the texturized region. The method includes forming a first protective layer over the texturized region and lightly doped diffusion region, where the first protective layer prevents damage to the texturized region and lightly doped diffusion region during manufacturing. Prior to forming the first protective layer, a dielectric layer is deposited over the texturized region, lightly doped diffusion region and the doped region. A plurality of contact openings are formed through the dielectric layer. Furthermore, the method also includes forming a first metal grid electrically coupled to the doped region through the contact openings and a second metal grid being electrically coupled to the first metal grid. In an embodiment, the first protective layer is composed of an etch resist.

In yet another example, a method for manufacturing a solar cell is disclosed. The method includes providing a solar cell having a front side which faces the sun during normal operation, a back side opposite the front side and a silicon substrate. The method includes forming a doped region on a silicon substrate of the solar cell and etching a texturized region on the silicon substrate. A lightly doped diffusion region is formed on the silicon substrate, where the lightly doped diffusion region is formed on the same side as the texturized region. The method includes depositing a first dielectric layer over the texturized region and lightly doped diffusion region, where the first dielectric layer prevents damage to the texturized region and lightly doped diffusion region during manufacturing. The method also includes depositing a second dielectric layer over the doped region. A plurality of contact openings are formed through the second dielectric layer. Furthermore, the method also includes forming a first metal grid electrically coupled to the doped region through the contact openings and a second metal grid being electrically coupled to the first metal grid. In an embodiment, the first dielectric layer is composed of silicon nitride (SiN) with a thickness in the range of 100-3000 Angstroms on the front side of the solar cell.

BRIEF DESCRIPTION OF THE DRAWINGS

A more complete understanding of the subject matter may be derived by referring to the detailed description and claims when considered in conjunction with the following figures, where like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Additionally, numerous specific details are set forth, such as specific process flow operations, in order to provide a thorough understanding of the method and its embodiments. It will be apparent to one skilled in the art that embodiments of the proposed methods may be practiced without these specific details. In other instances, well-known fabrication techniques, such as lithographic and etch techniques, are not described in detail in order to not unnecessarily obscure the method and its embodiments. Furthermore, it is to be understood that the various embodiments shown in the figures are illustrative representations and are not necessarily drawn to scale.

Figure 1:
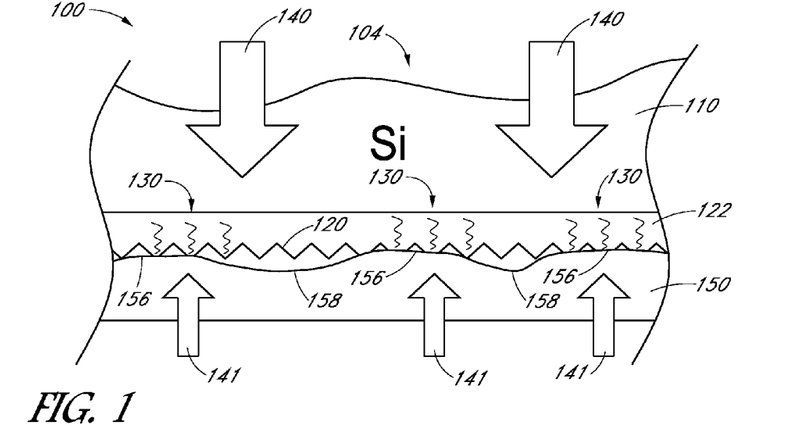
FIG. 1 is a cross-sectional representation of a solar cell undergoing a contact force.

It is well known that solar cells can be sensitive to structural damage during fabrication. Such structural damage can occur from contact forces and mechanical stress. These modes of structural damage can thus lead to several types of damage, such as, but not limited to, cracking, scratches, chips, contamination which can reduce the current generating capability of the solar cell or prevent the photovoltaic function altogether. Thus it is important for solar cell manufacturers take extra precaution when transferring solar cells to minimize yield loss from such mentioned modes of damage and to maximize solar cell production. In one example, the mode of damage can be from a solar cell fabrication process or a transfer method which can apply a contact force onto a solar cell. FIG. 1 shows a solar cell undergoing such a contact force.

FIG. 1 illustrates a solar cell undergoing a contact force. The solar cell 100 can include a silicon substrate 110 having a texturized region 120 and a diffusion region 122. In solar cell manufacture, screen printing is a common process used to form masks for subsequent etching, cleaning and in further preparation for metal contact formation. Screen printing requires the use of a squeegee to push an etch resist through a screen onto a solar cell to form a mask, where the squeegee pushes the solar cell 100 against a receiving medium 150 of a screen printer. In an example, the contact force 140 can be, but is not limited to, a force exerted by the squeegee on the solar cell during screen printing. In this example, the inventors found receiving mediums which are non-planar, rough or composed of uneven surfaces can be detrimental to a texturized surface of a solar cell. Specifically uneven surfaces can have raised surfaces 156 and lowered surfaces 158, where raised surfaces 156 can provide areas which concentrate a counter force 141, due to the contact force 140, on the texturized region 120 of the solar cell 100. The counter forces 141 can in turn damage localized areas of the texturized region 120 and the doped region 122, resulting in defects such as local high recombination areas 130 within the silicon substrate 110 of the solar cell 100. The local high recombination areas 130 can eventually lead to lifetime failure and solar cell efficiency loss.

Figure 2:
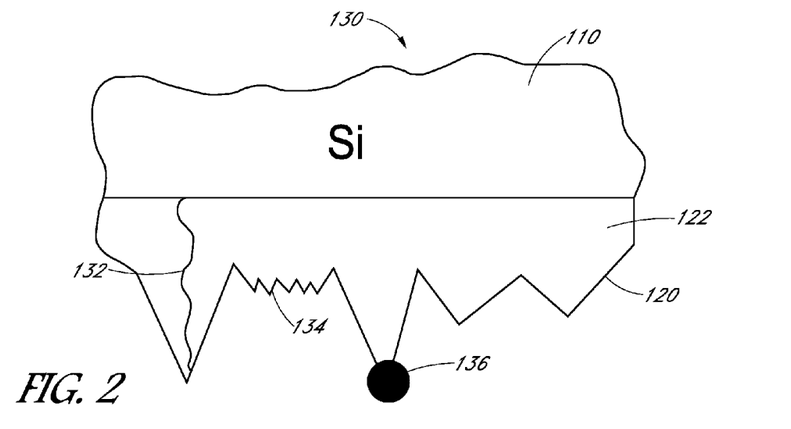
FIG. 2 is a cross-sectional representation of a local high recombination area of the solar cell of FIG. 1.

FIG. 2 illustrates a cross-sectional representation of a local high recombination area of the solar cell of FIG. 1. The local high recombination area 130 can include dislocations 132, such as break points, within the diffusion region 122 of the silicon substrate 110. The local high recombination area 130 can also include chips 134 along the edges of the texturized region 120. Scraping can also occur between the texturized region 120 and the receiving medium 150 of FIG. 2, allowing for contamination 136 on the solar cell 100 from foreign material scraped off the receiving medium 150.

Thus it is presented that screen printing can induce damage to the texturized region and diffusion region of a solar cell resulting in lifetime degradation and solar cell efficiency loss. Similarly, other modes of damage are known, such as due to transferring of solar cells, where transferring can include any method, either automatic or manual, used to transfer solar cells from a first location to a second location during, prior, after and in-between solar cell fabrication or manufacturing processes. For example, lateral damage, or scratching, to the texturized region can also occur when a solar cell is improperly secured on a receiving medium during transfer. In another example too much pressure exerted from a vacuum pad or gripper securing a solar cell during transfer can also result in damage of the texturized region and doped region as discussed above. In accordance with an embodiment, a plurality of solutions to the above mentioned issues are described below, including test results showing improved solar cell lifetime and solar cell efficiency performance. Also it should also be understood that the receiving medium can have a number of different interpretations such as a chuck, palette, jig, walking beam, mount or conveyor, where the receiving medium is not limited to the described an can include any other commonly used means for securing a solar cell during fabrication, manufacturing, transfer and transport. It is important to note a common measurement for the planarity of a the receiving medium is measured by taking at least three points along the receiving medium surface, a first point as reference or zero point and the next two measurements to determine planarity. If the planarity between the two remaining points with respect to the zero point is greater than a specified limit, usually measured in microns, then a particular surface can be determined as non-planar.

Figure 3:
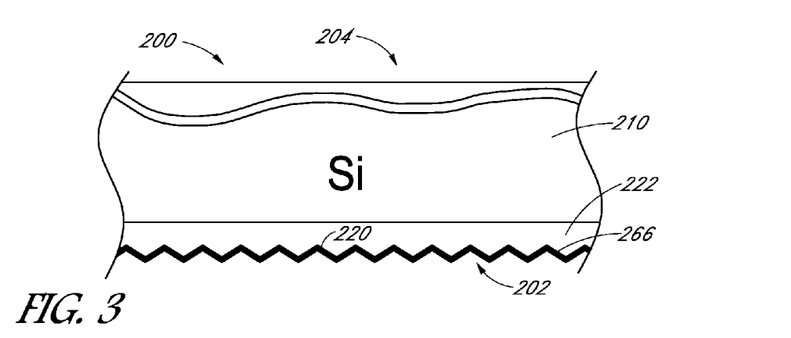
FIGS. 3-9 are a cross-sectional representations of a solar cell used in accordance with the presented methods of protecting a texturized region of a solar cell.

FIG. 3 illustrates a solar cell used in the succeeding proposed solutions to the above mentioned issues. The solar cell 200 having a front side 202 which faces the sun during normal operation and a back side 204 opposite the front side 202. The solar cell 200 also includes a silicon substrate 210. In some embodiments, the silicon substrate 210 is cleaned, polished, planarized, and/or thinned or otherwise processed. In another embodiment the silicon substrate 210 is composed of polysilicon or multi-crystalline silicon. In still another embodiment, the silicon substrate 210 includes first and second doped regions. In an embodiment, the first and second doped regions are instead first and second doped polysilicon regions. In another embodiment, a trench region separates both the first and second doped polysilicon regions. In still another embodiment, the trench region is texturized. In yet another embodiment, a tunnel oxide layer separates both the first and second doped polysilicon regions from the silicon substrate. In an embodiment, the first and second doped regions, or the first and second doped polysilicon regions, are formed by a thermal process, where each regions can include a doping material but is not limited to a positive-type dopant such as boron or a negative-type dopant such as phosphorous. Although both the first and second doped regions are described as being formed by a thermal process or through conventional doping process, respectively, as with any other formation, deposition, or growth process operation described or recited here, each layer or substance is formed using any appropriate process. For example, a chemical vapor deposition (CVD) process, low-pressure CVD (LPCVD), atmospheric pressure CVD (APCVD), plasma-enhanced CVD (PECVD), thermal growth, sputtering, as well as any other desired technique can be used where formation is described. The method also includes providing the solar cell 200 with a texturized region 220 on the front side 202 of the solar cell 200 for increased solar radiation collection. A texturized region 220 is one which has a regular or an irregular shaped surface for scattering incoming light, decreasing the amount of light reflected back of the surface of the solar cell 200. The solar cell 200 also includes a lightly doped diffusion region 222 on the front side 202. In an embodiment, the lightly doped diffusion region has a doping concentration in the range of $1 \times 10^{17}$-$1 \times 10^{19}$ cm$^{-3}$. In another embodiment, the lightly doped diffusion region has a doping concentration below $1 \times 10^{19}$ cm$^{-3}$. In still another embodiment, the lightly doped diffusion region extends less than 1 micron into the silicon substrate. In yet another embodiment, the lightly doped diffusion region of the solar cell is composed of silicon dioxide ($SiO_2$). In an embodiment, a first dielectric layer 266 is deposited over the texturized region 220. In another embodiment, the first dielectric layer 266 is composed of silicon nitride (SiN). In still another embodiment, the first dielectric layer is a anti-reflective layer (ARC) disposed on the front side 202 of the solar cell 200.

The inventors found the solar cell 200 described by FIG. 3, such as solar cells having texturized region 220 and lightly doped diffusion region 222 on the front side 202, can be very sensitive to damage particularly the contact damage discussed in FIGS. 1 and 2, where it should be noted that the texturized region and lightly doped region can also reside on the back side of the solar cell. Thus, a plurality of solutions to the above mentioned issues are proposed below. Also, the plurality of solutions are applicable to any solar cell with texturized region and a lightly doped region, where the solutions provide methods for preventing damage to a texturized region and a lightly doped region regardless of the location of the regions on the solar cell.

Figure 4:
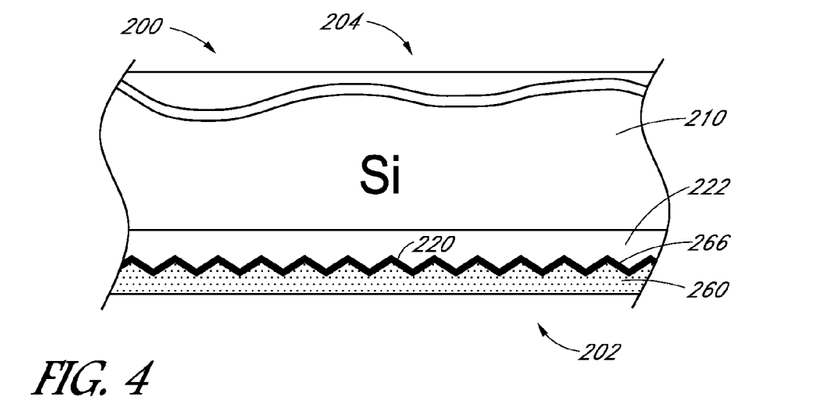
Figure 5:
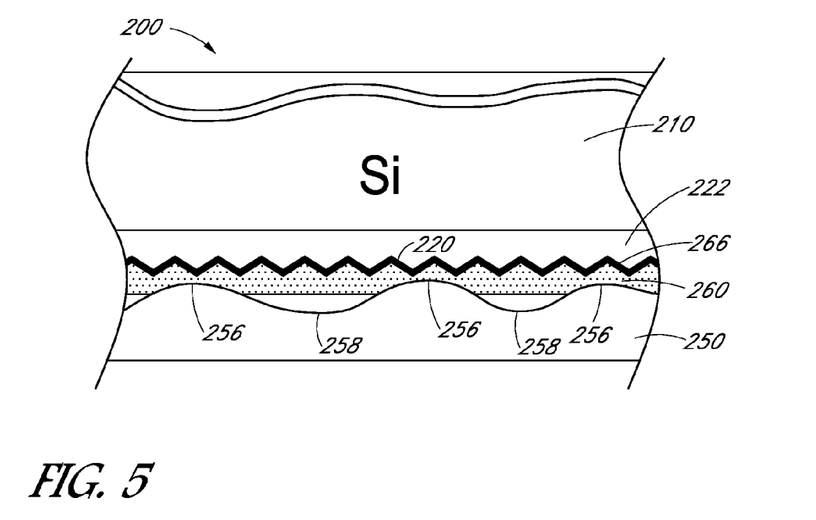

With reference to FIGS. 4 and 5, there are shown a method of forming a first etch resist on the solar cell of FIG. 3. The method includes providing the solar cell 200 of FIG. 3 and forming a first protective layer 260 on the front side 202 of the solar cell 200. As shown in FIG. 5, the solar cell 200 is subsequently placed on a receiving medium 250 with the front side 202 of the solar cell 200 placed on an upper surface 252 of the receiving medium 250. The receiving medium 250 can have an upper surface 252, a lower surface 254 and uneven surfaces, where the uneven surfaces have raised surfaces 256 and lowered surfaces 258. In an embodiment, the upper surface 252 of the receiving medium 250 has a planarity of greater than 50 microns.

Figure 6:
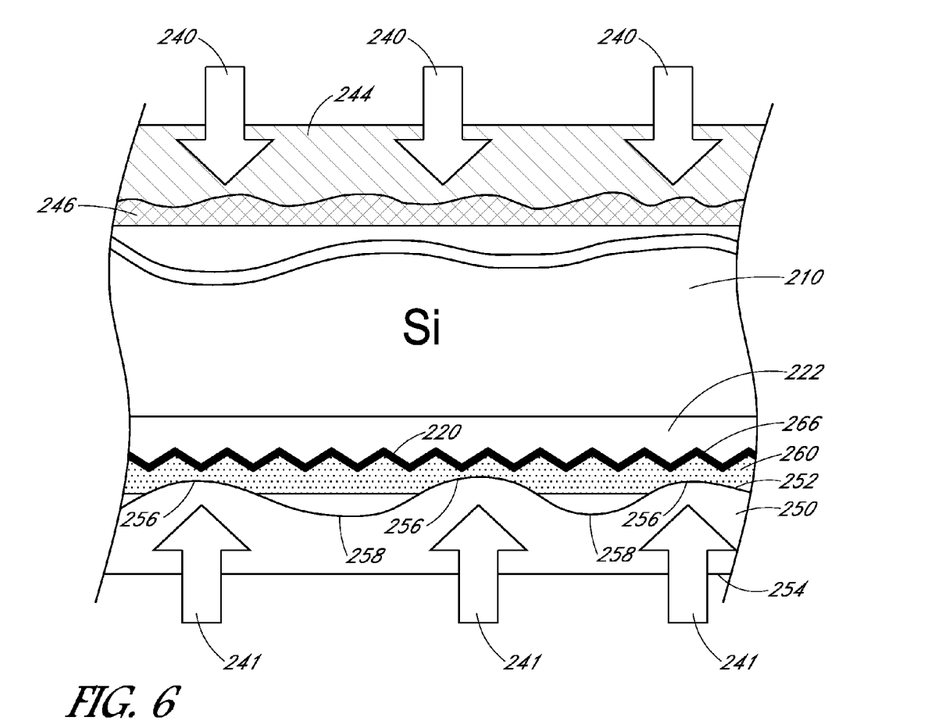

FIG. 6 illustrates the continued method of forming a first etch resist on the back side of the solar cell of FIGS. 4 and 5. The method includes depositing a first etch resist 246 on the back side 204 of the solar cell 200 using a contact printing method. During contact printing, a downward force 240, such as from a squeegee 244 of a screen printer pushes the solar cell 200 against the receiving medium 250. The raised surfaces 256 of the receiving medium 250 provides areas which concentrate a counter force 241 due to the contact force 240 on the solar cell 200. In contrast to FIG. 1, the first protective layer 260 prevents damage from the contact force 240 and the counter force 241 to the texturized region 220, lightly doped diffusion region 222 and also prevents the formation of the local high recombination areas 130 shown in FIGS. 1 and 2. The first protective layer 260 also protects against mechanical damage and stress on the front side 202 of the solar cell 200 that can lead to cracking, scratches, chips, contamination or any other damage which can reduce the current generating capability of the solar cell 200 or prevent the photovoltaic function altogether. The method also includes subsequently removing the solar cell 200 from the receiving medium 250 and curing the first etch resist 246. In an embodiment, forming the first protective layer 260 includes depositing a second etch resist on the front side of the solar cell 200 prior to forming the first etch resist 246. The second etch resist is cured to form a first protective layer 260 on the front side 202 of the solar cell 200. In another embodiment, the first 246 and second etch resist is composed of any etch resist commonly used in the fabrication of solar cells.

Figure 7:
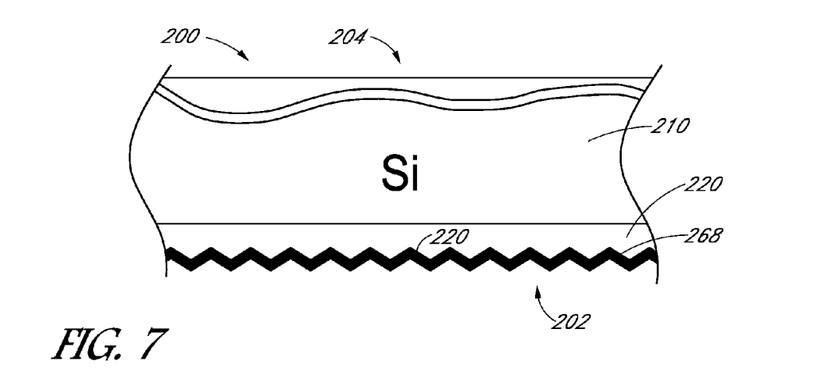

With reference to FIG. 7 there is shown an embodiment for forming the first protective layer of FIG. 4-6. In an embodiment, forming the first protective layer instead includes depositing a thick nitride film 268. In another embodiment, the thick nitride film 268 replaces the first dielectric layer 266 of FIG. 3. In still another embodiment, forming the first protective layer instead includes a depositing a thick nitride film 268 composed of silicon nitride (SiN) with a thickness in the range of 100-3000 Angstroms on the front side of the solar cell. In yet another embodiment, depositing the thick nitride film 268 includes depositing an anti-reflective layer (ARC) on the front side 202 of the solar cell 200.

Figure 8:
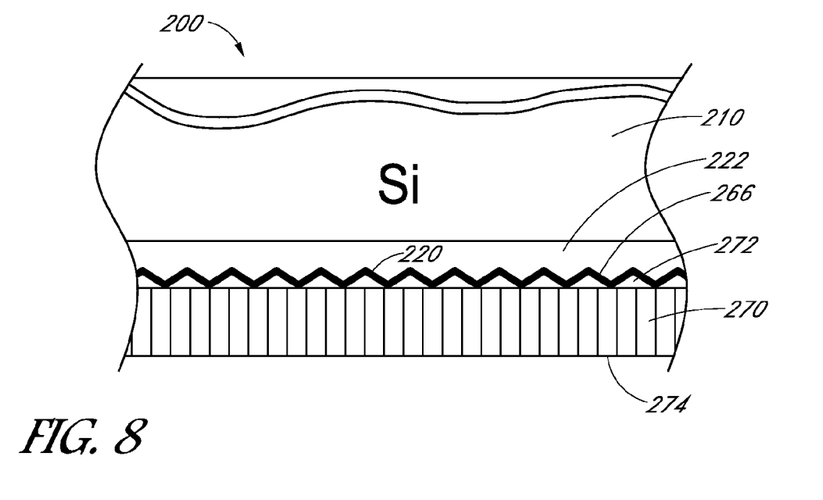
Figure 9:
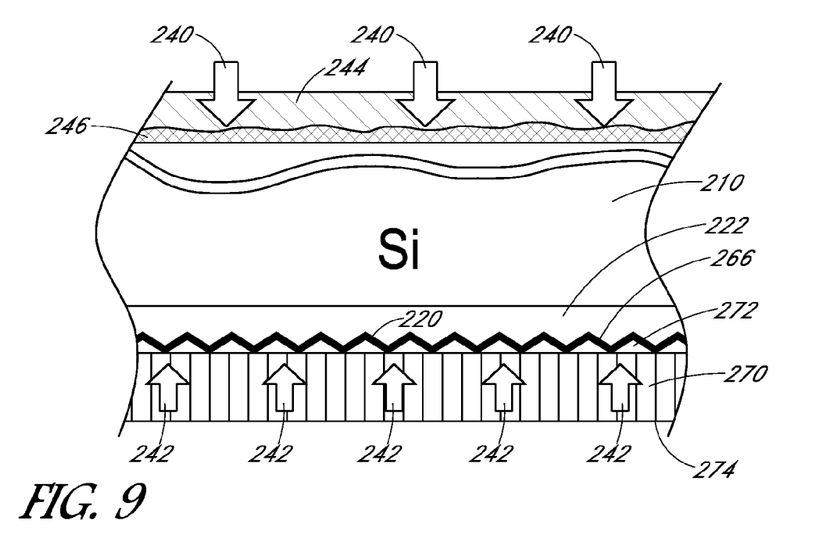

FIGS. 8 and 9 illustrate another method for forming a first etch resist on the solar cell of FIG. 3. The method includes placing the solar cell 200 of FIG. 3 unto a receiving medium 270 with the front side 202 of the solar cell 200 placed on an upper surface 272 of the receiving medium 270 as shown in FIG. 8. In an embodiment, the receiving medium 270 is planar or without uneven areas and is composed of an upper surface 272 and a lower surface 274. As shown in FIG. 9, the method also includes depositing a first etch resist 246 on the back side 204 of the solar cell 200 using a contact printing method.

During printing, a contact force 240 due to a contact printing method, such as from a squeegee 244 of a screen printer, pushes the solar cell 200 against an upper surface 272 of a receiving medium 270, where the receiving medium 270 prevents damage to the texturized region 220 and lightly doped diffusion region 222 of the solar cell 200. In an embodiment, the receiving medium allows a counter force 242 to be uniformly spread on the texturized region 220 preventing damage to the texturized region 220 of the solar cell 200. In an embodiment, the receiving medium 270 has a planarity of at most 50 microns. In an embodiment, the method also includes removing the solar cell 200 from the receiving medium 270 and curing the first etch resist 246. In another embodiment, the receiving medium 270 is made of a material having a moh's hardness in the range of 5-10. In another embodiment, the upper surface 272 of the receiving medium 270 prevents damage to the texturized region 220 during printing after between 1-50,000 uses. In still another embodiment, the upper surface 272 of the receiving medium maintains a constant planarity after between 1-50,000 uses. In yet another embodiment, the receiving medium 270 is composed of a material selected from the group consisting of aluminum, anodized aluminum, hard anodized aluminum, glass and tempered glass. In an embodiment, the receiving medium 270 is a chuck, palette, jig, walking beam, mount or conveyor. In an embodiment, the receiving medium 270 maintains a planar surface to the squeegee 244 of a screen printer. In another embodiment, the planarity difference between the squeegee 244 and the receiving medium 270 is less than 55 microns.

Still another method for forming a first etch resist on the solar cell of FIG. 3 is disclosed. The method includes depositing a first etch resist on the back side of the solar cell of FIG. 3 using a non-contact printing method such as ink-jet printing. Ink jet printing, similar to screen printing, is a process used to form masks for subsequent etching, cleaning and in further preparation of metal contact formation. As discussed above screen printing requires a contact force to deposit an etch resist on the solar cell. In contrast to screen printing, ink-jet printing deposits an etch resist without contacting the solar cell and thus, no damage is induced on the solar cell during a mask formation process. The inventors found that using non-contact printing methods such as ink-jet printing provides for a means to prevent damage to the texturized region and lightly doped diffusion region of a solar cell during a mask formation process. It should be noted that any non-contact printing method can be used in contrast to contact printing, such as screen printing, to prevent damage to the texturized region of a solar cell.

Figure 10:
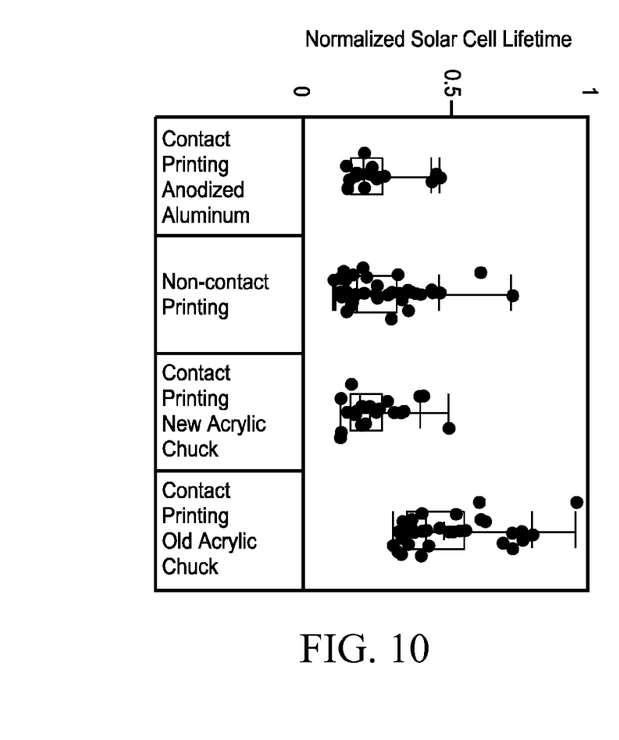
FIG. 10 is a graphical representation of test results for solar cell lifetime comparison between several solar cells used in accordance with the presented methods of protecting a texturized region of a solar cell.

With reference to FIG. 10, there is shown normalized solar cell lifetime test results comparing several solar cells fabricated using the different solutions proposed above. The test result includes normalized solar cell lifetime results for the solar cells of FIG. 3 fabricated using non-contact printing, contact printing using an anodized aluminum chuck, contact printing using a new acrylic chuck and contact printing using an old acrylic chuck. The old acrylic chuck has been used more than 50,000 times and a new chuck has been used within the range of 1-50,000 times. For this test, ink-jet printing was used for non-contact printing and screen printing was used for contact printing. Also, since the lifetime test results are normalized, results that are lower or much less than 1 imply improved solar cell performance. It can be observed that solar cells fabricated using the non-contact printing process show improved lifetime. The same observation can be seen for the case using a contact printing method with an anodized aluminum chuck. Similarly, the same observation can be seen for the case using a contact printing method with a new acrylic chuck. For the case using a contacting printing method with the old acrylic chuck, there is observable lifetime degradation. The inventors hypothesize chucks having a moh's hardness less than 5 degrade easily, where the surface of the old acrylic chuck becomes rougher and less planar over continued use. As discussed above, rough or uneven chucks can damage a texturized region of a solar cell leading to device malfunction. In this test, the old acrylic chuck was used roughly greater than 50,000 uses. Thus the results confirm the hypotheses of the inventors, where using receiving mediums, such as chucks, in a contact-type process or during transferring can degrade the texturized of a solar cell resulting in higher solar cell lifetime and thus degraded photovoltaic performance.

Figure 11:
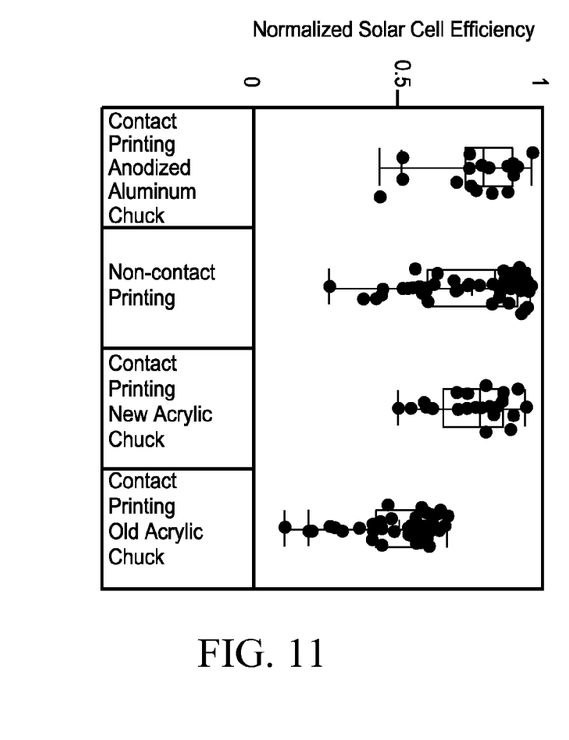
FIG. 11 is a graphical representation of test results for solar cell efficiency comparison between several solar cells used in accordance with the presented methods of protecting a texturized region of a solar cell.

FIG. 11 illustrate normalized solar cell efficiency test results comparing several solar cells fabricated using the different solutions proposed above. The test results includes normalized solar cell efficiency test results for solar cells fabricated using non-contact printing, contact printing with an anodized aluminum chuck, contact printing with a new acrylic chuck and contact printing with an old acrylic chuck. As discussed above, ink-jet printing was used for non-contact printing and screen printing was used for contact printing. Since the solar cell efficiency test results are normalized, results that are higher or much closer to 1 imply improved solar cell performance. The data shows that the contact printing process using both the anodized aluminum and the new acrylic chuck is comparable to the non-contact printing process, where improved solar cell efficiency is observed. The inventors hypothesize chucks having a moh's hardness less than 5 degrade easily, where the surface of the old acrylic chuck becomes rougher and less planar over continued use. In this test, the old acrylic chuck was used roughly greater than 50,000 uses. The results confirm the hypotheses of the inventors, where using rough or uneven receiving mediums, such as old acrylic chucks, in a contact-type process or during transferring can degrade the texturized region and lightly doped diffusion region of a solar cell resulting in lower solar cell efficiency and thus degraded photovoltaic performance. The inventors also found similar results for glass and tempered glass based chucks, where the glass based chucks are even more robust to repeated use, similar to anodized aluminum, and have the property of being transparent, where transparent chucks can be used for machine vision inspection applications.

Figure 12:
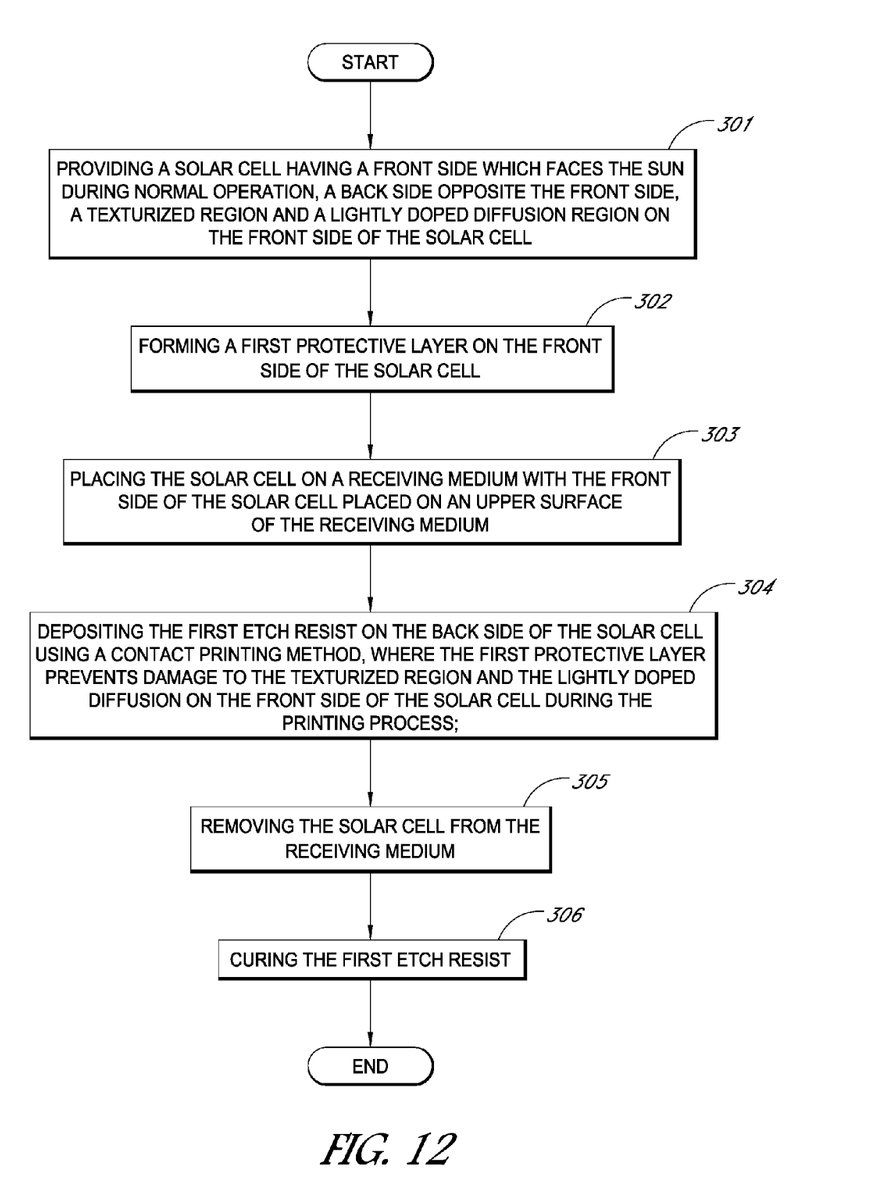
FIGS. 12 and 13 are flowchart representations of the presented methods for forming a first etch resist on a solar cell.

With reference to FIG. 12 there is shown a flowchart of an embodiment of a method for forming a first etch resist on a solar cell. As described above, the first operation 301 can include providing a solar cell having a front side which faces the sun during normal operation, a back side opposite the front side, a texturized region and a lightly doped diffusion region on the front side of the solar cell. A second operation 302 can include forming a first protective layer on the front side of the solar cell. A third operation 303 can include placing the solar cell on a receiving medium with the front side of the solar cell placed on an upper surface of the receiving medium. A fourth operation can include depositing the first etch resist on the back side of the solar cell using a contact printing method, where the first protective layer prevents damage to the texturized region and the lightly doped diffusion on the front side of the solar cell during the printing process. A fifth operation 305 can include removing the solar cell from the receiving medium. The last operation can include curing the first etch resist. In an embodiment, the first etch resist is a plating resist. In another embodiment, depositing the first etch resist comprises screen printing the first etch resist. In still another embodiment, the curing the first etch resist comprises performing a method selected from the group consisting of thermal cure and photo-curing. In yet another embodiment forming the first protective layer further includes depositing a second etch resist on the front side of the solar cell prior to forming a first etch resist and curing the second etch resist to form a first protective layer on the front side of the solar cell. In another embodiment, forming the first protective layer comprises a depositing silicon nitride (SiN) with a thickness in the range of 100-3000 Angstroms on the front side of the solar cell. In still another embodiment, the method for forming a first etch resist on a solar cell is employed for any applicable solar cell fabrication printing, masking or applicable process which subsequently provides a solar cell with a texturized region and a lightly doped diffusion region and as defined herein.

Figure 13:
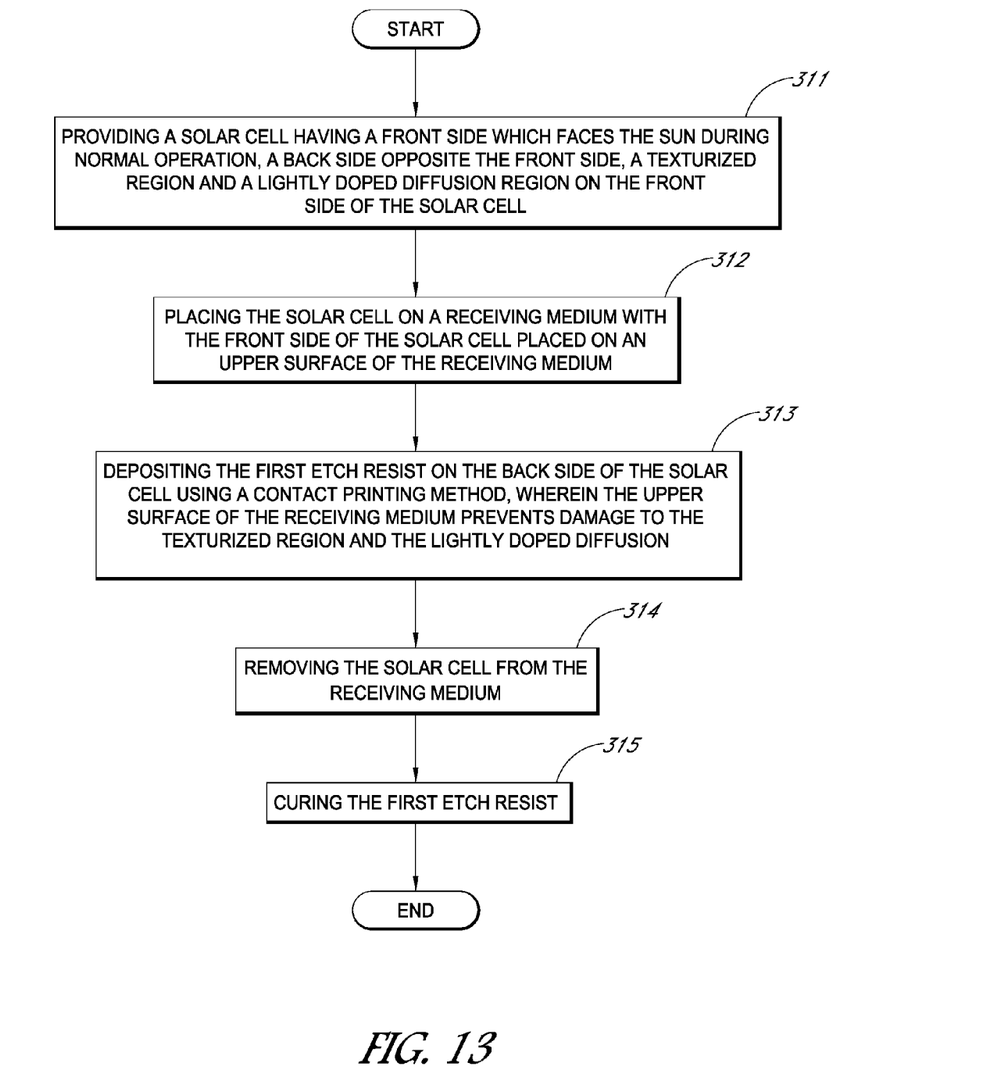

FIG. 13 illustrates a flowchart of another method for forming a first etch resist on a solar cell. As described above, the first operation 311 can include providing a solar cell having a front side which faces the sun during normal operation, a back side opposite the front side, a texturized region and a lightly doped diffusion region on the front side of the solar cell. A second operation 312 can include placing the solar cell on a receiving medium with the front side of the solar cell placed on an upper surface of the receiving medium. A third operation 313 can include depositing the first etch resist on the back side of the solar cell using a contact printing method, where the upper surface of the receiving medium prevents damage to the texturized region and the lightly doped diffusion. A fourth operation 314 can include removing the solar cell from the receiving medium and a last operation 315 can include curing the first etch resist. In an embodiment, the lightly doped diffusion region has a doping concentration below $1\times10^{19}$ $cm^{-3}$. In another embodiment, the lightly doped diffusion region has a doping concentration in the range of $1\times10^{17}$-$1\times10^{19}$ $cm^{-3}$. In still another embodiment, the lightly doped diffusion region extends less than 1 micron into the silicon substrate. In yet another embodiment, the receiving medium comprises a material having a mohs hardness in the range of 5-10. In an embodiment, the upper surface of the receiving medium prevents damage to the texturized region and the lightly doped diffusion region during printing after between 1-50,000 uses. In another embodiment, the upper surface of the receiving medium maintains a constant planarity after between 1-50,000 uses. In still another embodiment, the receiving medium comprises a material selected from the group consisting of acrylic, aluminum, anodized aluminum, hard anodized aluminum, glass and tempered glass. In yet another embodiment, depositing the first etch resist comprises screen printing the first etch resist. In another embodiment, the method for forming a first etch resist on a solar cell is employed for any applicable solar cell fabrication printing, masking or applicable process which subsequently provides a solar cell with a texturized region and a lightly doped diffusion region and as defined herein.

Figure 14:
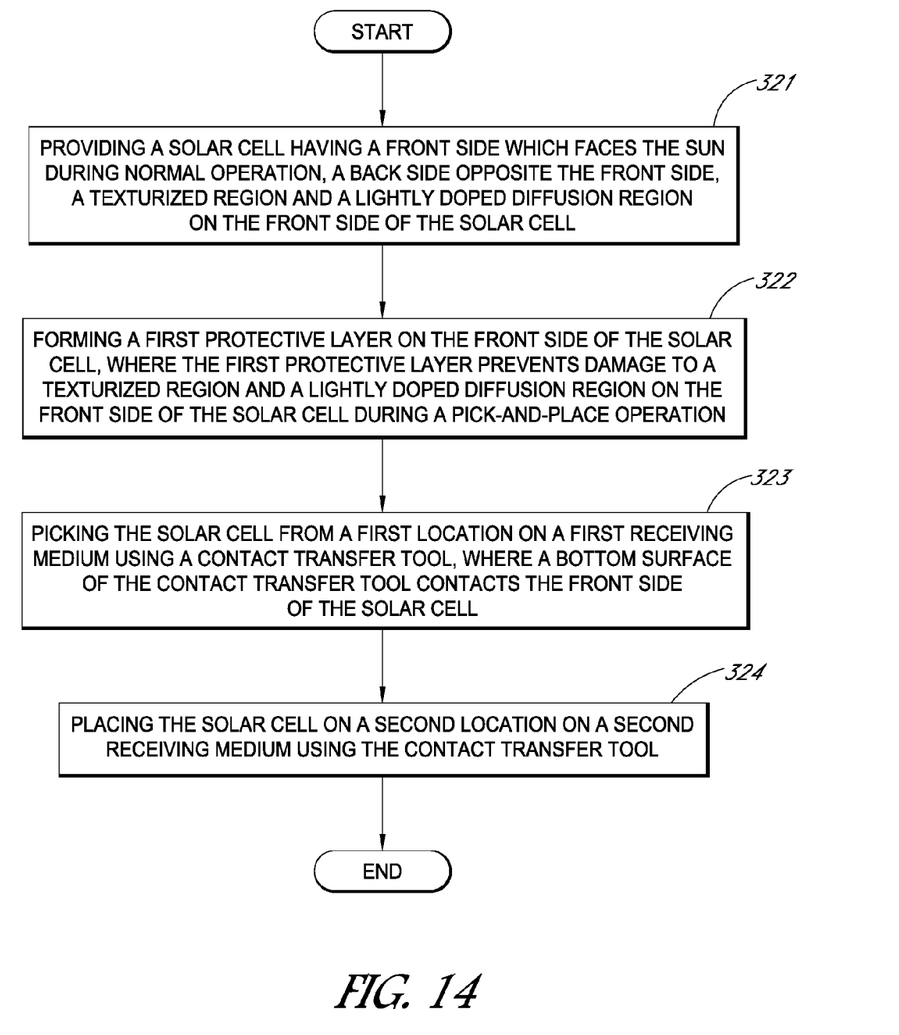
FIGS. 14 and 15 are flowchart representations of the presented methods for transferring a solar cell from a first location to a second location.

With reference to FIG. 14, there is shown a flowchart for a method of transferring a solar cell from a first location to a second location. As described above, the first operation 321 can include providing a solar cell having a front side which faces the sun during normal operation, a back side opposite the front side, a texturized region and a lightly doped diffusion region on the front side of the solar cell. A second operation 322 can include forming a first protective layer on the front side of the solar cell, where the first protective layer prevents damage to a texturized region and a lightly doped diffusion on the front side of the solar cell during a pick-and-place operation. A third operation 323 can include picking the solar cell from a first location on a first receiving medium using a contact transfer tool, where a bottom surface of the contact transfer tool contacts the front side of the solar cell. A last operation 324 can include placing the solar cell on a second location on a second receiving medium using the contact transfer tool. In an embodiment, forming the first protective layer includes depositing a second etch resist on the front side of the solar cell and curing the second etch resist to form a first protective layer on the front side of the solar cell. In another embodiment, the second etch resist is any etch resist commonly used in the fabrication of solar cells. In still another embodiment, depositing the second etch resist comprises screen printing the second etch resist. In yet another embodiment, the curing the second etch resist comprises photo-curing the second etch resist. In another embodiment, forming the first protective layer comprises forming a first dielectric layer on the front side of the solar cell. In still another embodiment forming the first dielectric layer comprises depositing an anti-reflective layer commonly used in the manufacture of solar cells. In yet another embodiment, forming the first dielectric layer comprises depositing silicon nitride (SiN) on the front side of the solar cell. In an embodiment, forming the first dielectric layer comprises a depositing silicon nitride (SiN) with a thickness in the range of 100-3000 Angstroms. In another embodiment, the lightly doped diffusion region has a doping concentration below $1\times10^{19}$ $cm^{-3}$. In still another embodiment, the lightly doped diffusion region has a doping concentration in the range of $1\times10^{17}$-$1\times10^{19}$ $cm^{-3}$. In yet another embodiment, lightly doped diffusion region extends less than 1 micron into the silicon substrate. In an embodiment, the first and second receiving mediums comprise a receiving medium selected from the group consisting of chuck, palette, jig, walking beam, mount and conveyor. In another embodiment, the method for transferring a solar cell from a first location to a second location is employed for any applicable solar cell fabrication, transport or transfer process which subsequently provides a solar cell with a texturized region and a lightly doped diffusion region and as defined herein.

Figure 15:
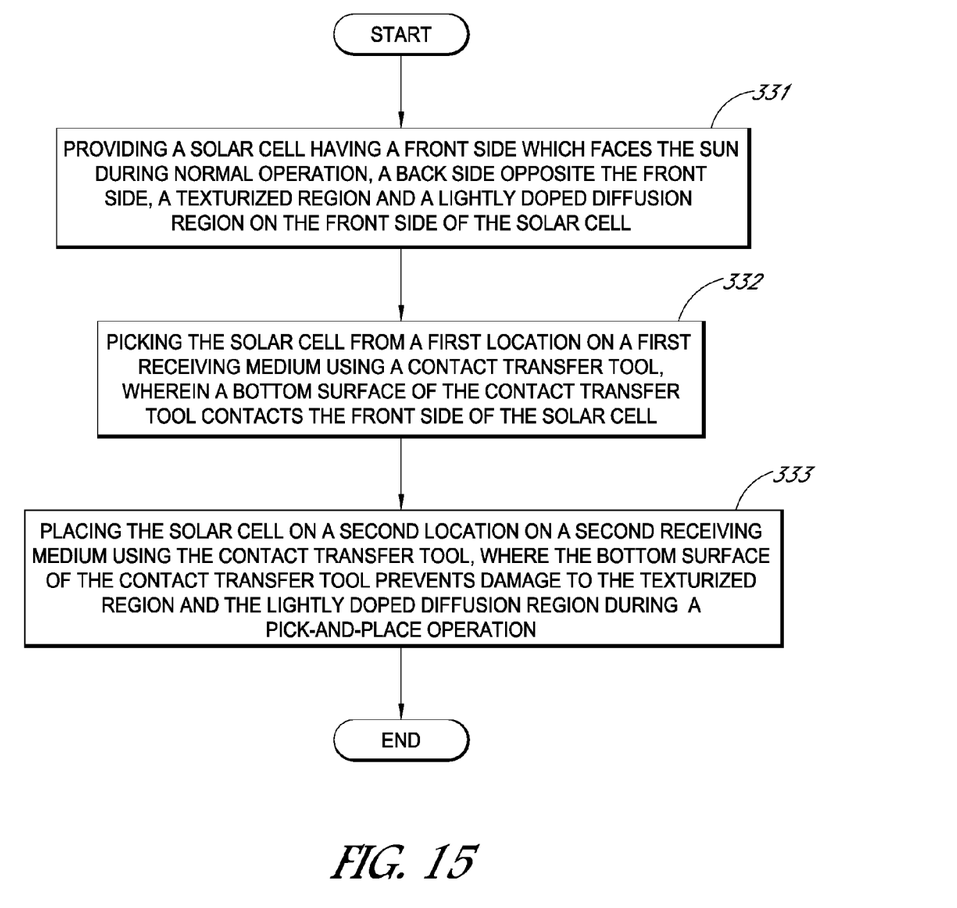

FIG. 15 illustrates a flowchart for another method of transferring a solar cell from a first location to a second location. As described above, the first operation 331 can includes providing a solar cell having a front side which faces the sun during normal operation, a back side opposite the front side, a texturized region and a lightly doped diffusion region on the front side of the solar cell. A second operation 332 can include picking the solar cell from a first location on a first receiving medium using a contact transfer tool, where a bottom surface of the contact transfer tool contacts the front side of the solar cell. And a last operation 313 can include placing the solar cell on a second location on a second receiving medium using the contact transfer tool, where the bottom surface of the contact transfer tool prevents damage to the texturized region and the lightly doped diffusion region during a pick-and-place operation. In an embodiment, the lightly doped diffusion region has a doping concentration below $1\times10^{19}$ $cm^{-3}$. In another embodiment, the lightly doped diffusion region has a doping concentration in the range of $1\times10^{17}$-$1\times10^{19}$ $cm^{-3}$. In still another embodiment, the lightly doped diffusion region has a doping concentration in the range of $1\times10^{17}$-$1\times10^{19}$ $cm^{-3}$. In yet another embodiment, the receiving medium comprises a material having a moh's hardness in the range of 5-10. In an embodiment, the upper surface of the receiving medium prevents damage to the texturized region during printing after between 1-50,000 uses. In another embodiment, the upper surface of the receiving medium maintains a constant planarity after between 1-50,000 uses. In still another embodiment, the receiving medium comprises a material selected from the group consisting of acrylic, aluminum, anodized aluminum, hard anodized aluminum, glass and tempered glass. In yet another embodiment, the receiving medium comprises a receiving medium selected from the group consisting of chuck, palette, jig, walking beam, mount and conveyor. In an embodiment, the method for transferring a solar cell from a first location to a second location is employed for any applicable solar cell fabrication, transport or transfer process which subsequently provides a solar cell with a texturized region and a lightly doped diffusion region and as defined herein.

Figure 16:
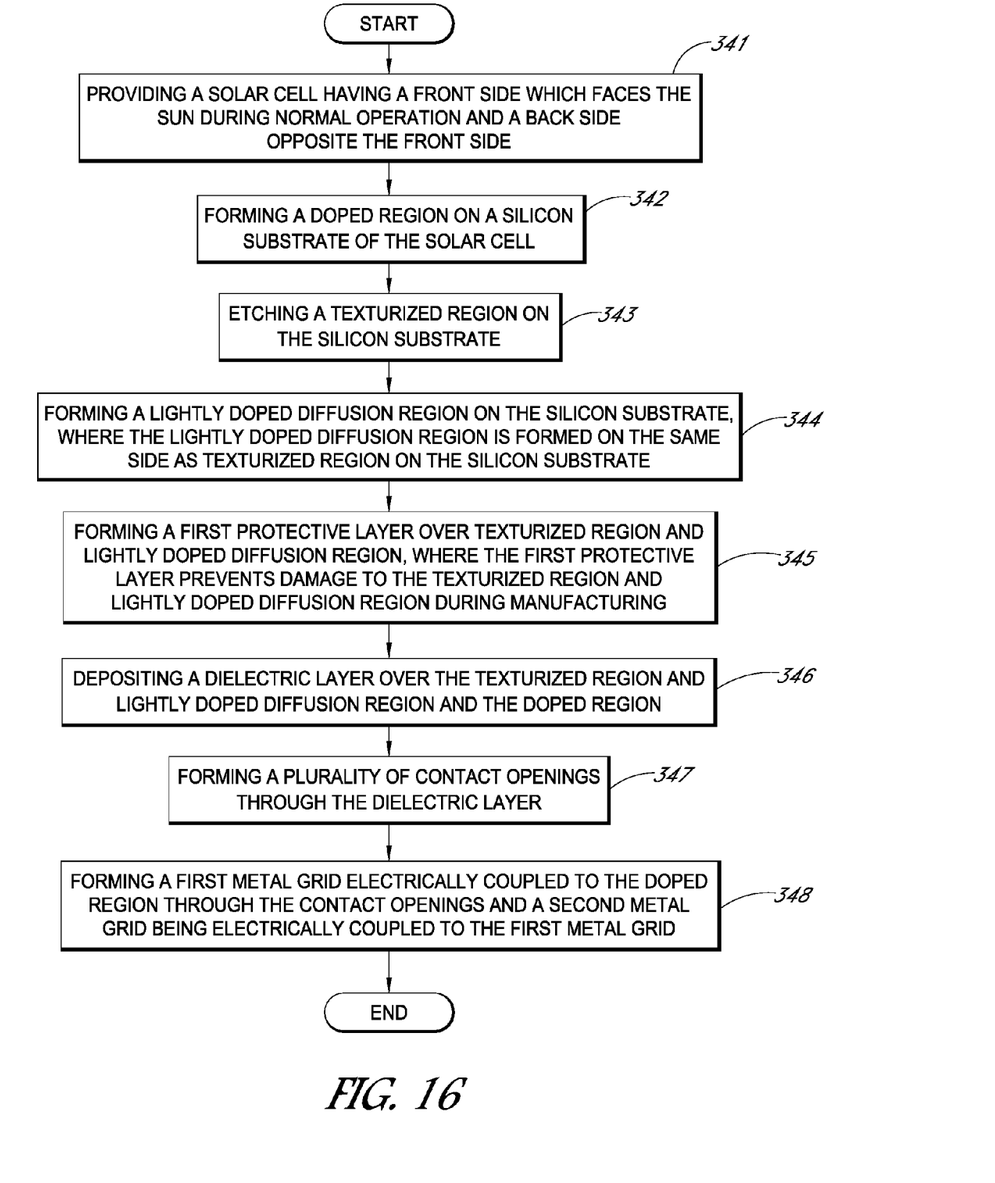
FIGS. 16 and 17 are flowchart representations of the presented methods of manufacturing a solar cell.

With reference to FIG. 16, there are shown a flowchart for a method of manufacturing a solar cell. As described above, the first operation 341 can include providing a solar cell having a front side which faces the sun during normal operation and a back side opposite the front side. A second operation 342 can include forming a doped region on a silicon substrate of the solar cell. A third operation 343 can include etching a texturized region on the silicon substrate. A fourth operation can include forming a lightly doped diffusion region on the silicon substrate, where the lightly doped diffusion region is formed on the same side as texturized region on the silicon substrate on. A fifth operation 345 can include forming a first protective layer over texturized region and lightly doped diffusion region, where the first protective layer prevents damage to the texturized region and lightly doped diffusion region during manufacturing. A sixth operation 346 can include depositing a dielectric layer over the texturized region and lightly doped diffusion region and the doped region. A seventh operation can include forming a plurality of contact openings through the dielectric layer. A last operation 318 can include forming a first metal grid electrically coupled to the doped region through the contact openings and a second metal grid being electrically coupled to the first metal grid. In an embodiment forming the first protective layer further includes depositing a second etch resist on the front side of the solar cell prior to forming a first etch resist and curing the second etch resist to form a first protective layer on the front side of the solar cell. In an embodiment, the second etch resist is any standard etch resist used in the manufacturing or fabrication of solar cells.

Figure 17:
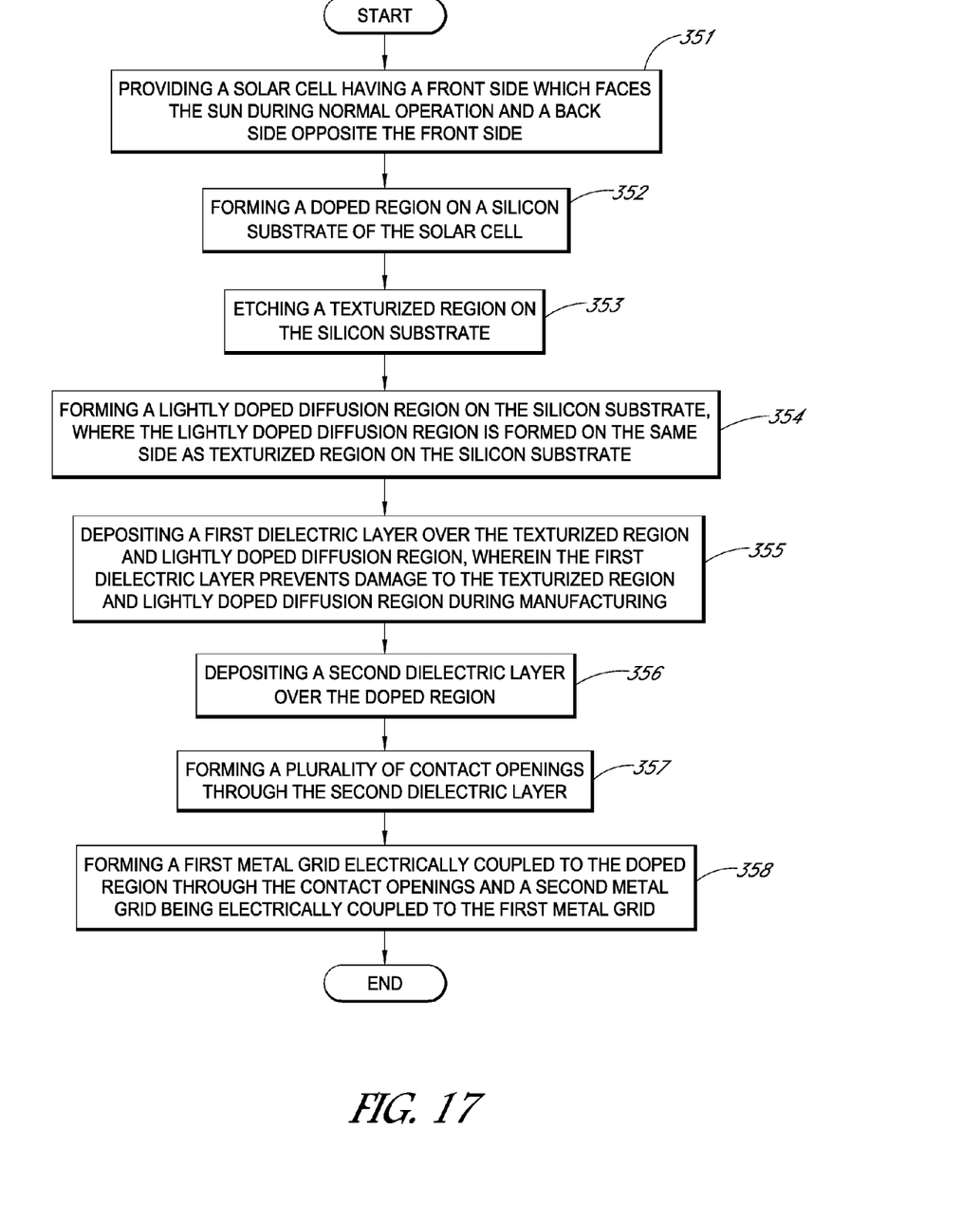

FIG. 17 illustrates a flowchart for another method of manufacturing a solar cell. As described above, the first operation 351 can include providing a solar cell having a front side which faces the sun during normal operation and a back side opposite the front side. A second operation 352 can include forming a doped region on a silicon substrate of the solar cell. A third operation 353 can include etching a texturized region on the silicon substrate. A fourth operation 354 can include forming a lightly doped diffusion region on the silicon substrate, where the lightly doped diffusion region is formed on the same side as texturized region on the silicon substrate. A fifth operation 355 can include depositing a first dielectric layer over the texturized region and lightly doped diffusion region, where the first dielectric layer prevents damage to the texturized region and lightly doped diffusion region during manufacturing. A sixth operation 356 can include depositing a second dielectric layer over the doped region. A seventh operation 357 can include forming a plurality of contact openings through the second dielectric layer. A last operation 358 can include forming a first metal grid electrically coupled to the doped region through the contact openings and a second metal grid being electrically coupled to the first metal grid. In still another embodiment, forming the first dielectric layer comprises a depositing silicon nitride (SiN) with a thickness in the range of 100-3000 Angstroms on the front side of the solar cell.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method of forming a first etch resist on a solar cell, the solar cell having a front side which faces the sun during normal operation and a back side opposite the front side, and the method comprising:
    placing the solar cell on a receiving medium with the front side of the solar cell placed on an upper surface of the receiving medium, wherein the solar cell comprises a texturized region and a lightly doped diffusion region on the front side;
    depositing the first etch resist on the back side of the solar cell using a contact printing method, wherein the upper surface of the receiving medium prevents damage to the texturized region and the lightly doped diffusion region;
    removing the solar cell from the receiving medium; and
    curing the first etch resist.

2. The method of claim 1, wherein the lightly doped diffusion region has a doping concentration below $1\times10^{19}$ cm$^{-3}$.

3. The method of claim 1, wherein the lightly doped diffusion region has a doping concentration in the range of $1\times10^{17}$-$1\times10^{19}$ cm$^{-3}$.

4. The method of claim 1, wherein the lightly doped diffusion region extends less than 1 micron into the silicon substrate.

5. The method of claim 1, wherein the receiving medium comprises a material having a mohs hardness in the range of 5-10.

6. The method of claim 1, wherein the upper surface of the receiving medium prevents damage to the texturized region and the lightly doped diffusion region during printing after between 1-50,000 uses.

7. The method of claim 1, wherein the upper surface of the receiving medium maintains a constant planarity after between 1-50,000 uses.

8. The method of claim 1, wherein the receiving medium comprises a material selected from the group consisting of acrylic, aluminum, anodized aluminum, hard anodized aluminum, glass and tempered glass.

9. The method of claim 1, wherein depositing the first etch resist comprises screen printing the first etch resist.

10. A method of forming a plating resist on a solar cell, the solar cell having a front side which faces the sun during normal operation and a back side opposite the front side, and the method comprising:
    placing the solar cell on a receiving medium comprising a material having a mohs hardness in the range of 5-10 with the front side of the solar cell placed on an upper surface of the receiving medium, wherein the solar cell comprises a texturized region and a lightly doped diffusion region with a doping concentration below $1 \times 10^{19}$ $cm^{-3}$ on the front side;

depositing the plating resist on the back side of the solar cell using a contact printing method, wherein the upper surface of the receiving medium prevents damage to the texturized region and the lightly doped diffusion region;

removing the solar cell from the receiving medium; and photo-curing the plating resist.

11. The method of claim 10, wherein the receiving medium comprises a material selected from the group consisting of acrylic, aluminum, anodized aluminum, hard anodized aluminum, glass and tempered glass.

12. The method of claim 10, wherein depositing the first etch resist comprises screen printing the first etch resist.

13. The method of claim 10, wherein the upper surface of the receiving medium prevents damage to the texturized region and the lightly doped diffusion region during printing after between 1-50,000 uses.

14. The method of claim 10, wherein the upper surface of the receiving medium maintains a constant planarity after between 1-50,000 uses.

15. A method of forming a first etch resist on a solar cell, the solar cell having a front side which faces the sun during normal operation and a back side opposite the front side, and the method comprising:

forming a first protective layer on the front side of the solar cell, wherein the solar cell comprises a texturized region and a lightly doped diffusion region on the front side;

placing the solar cell on a receiving medium with the front side of the solar cell placed on an upper surface of the receiving medium;

depositing the first etch resist on the back side of the solar cell using a contact printing method, wherein the first protective layer prevents damage to the texturized region and the lightly doped diffusion on the front side of the solar cell during the contact printing process;

removing the solar cell from the receiving medium; and curing the first etch resist.

16. The method of claim 15, wherein the first etch resist is a plating resist.

17. The method of claim 15, wherein depositing the first etch resist comprises screen printing the first etch resist.

18. The method of claim 15, wherein the curing the first etch resist comprises performing a method selected from the group consisting of thermal cure and photo-curing.

19. The method of claim 1, wherein forming the first protective layer comprises:

depositing a second etch resist on the front side of the solar cell prior to forming a first etch resist; and curing the second etch resist to form a first protective layer on the front side of the solar cell.

20. The method of claim 15, wherein forming the first protective layer comprises a depositing silicon nitride (SiN) with a thickness in the range of 100-3000 Angstroms on the front side of the solar cell.

* * * * *